United States Patent [19]
Bowen et al.

[11] Patent Number: 5,568,094
[45] Date of Patent: Oct. 22, 1996

[54] RF POWER AMPLIFIER WITH INCREASED EFFICIENCY AT LOW POWER

[75] Inventors: John W. Bowen, Buck; Dwight Daugherty, Lancaster; Stuart H. Wemple, Berks, all of Pa.; Melvin West, Jr., Burlington, N.J.

[73] Assignee: AT&T Corp., Murray Hill, N.J.

[21] Appl. No.: 356,812

[22] Filed: Dec. 15, 1994

[51] Int. Cl.⁶ .................................................... H03G 3/30
[52] U.S. Cl. ........................... 330/279; 330/284; 330/285
[58] Field of Search .................................... 330/129, 133, 330/134, 279, 284, 285

[56] References Cited

U.S. PATENT DOCUMENTS

| | | | |
|---|---|---|---|
| 4,646,028 | 2/1987 | Palmer | 330/277 |
| 5,208,550 | 5/1993 | Iwane | 330/129 |
| 5,241,694 | 8/1993 | Vais/anen et al. | 330/284 X |
| 5,250,912 | 10/1993 | Fujita | 330/285 |
| 5,307,512 | 8/1994 | Mitzlaff | 330/284 X |
| 5,329,249 | 7/1994 | Cripps | 330/302 |

Primary Examiner—Steven Mottola

[57] ABSTRACT

An apparatus and method is provided that uses a simple voltage ratio technique to supply specific voltages to a voltage variable attenuator, and the gates of a GaAs RF power amplifier in order to control the efficiency of the amplifier. The output of the power amplifier is sampled and then fed back to the variable voltage attenuator as a control signal. A ratio portion of the control signal is then used to control the gate biases of the power amplifier. When the power requirements are less than maximum, the voltage ratio will become more negative, resulting in less current. As the RF output increases, the voltage ratio will become more positive. Therefore, as the DC voltage varies, the power amplifier's output power will vary accordingly providing the desired output power with enhanced efficiency.

10 Claims, 2 Drawing Sheets

5,568,094

RF POWER AMPLIFIER WITH INCREASED EFFICIENCY AT LOW POWER

BACKGROUND OF THE INVENTION

1. Field of the Invention

This invention relates generally to RF power amplifiers and more particularly to increasing the amplifier's efficiency at low power inputs.

2. Description of the Related

Today's mobile communication systems require high performance transmitters that are able to operate over wide output power ranges and input voltage supply variations without impacting the performance of the system. The proximity of the transmitter with respect to its base station will determine the value of a control signal that correspondingly controls the amount of output power the RF power amplifier must deliver to the antenna. This control signal is normally a pre-programmed range of voltages that correspond to a minimum and maximum operating output power of the power amplifier. Required power levels that fall between the minimum and maximum are typically extrapolated. Also, with mobile communications, the supply voltages tend to change radically with the charge and discharge cycle of the battery. These variations in voltage can adversely effect output power when the voltage is below nominal value and adversely effect the efficiency when voltage is above nominal value.

An existing power amplifier (PA) solution has been implemented using a voltage variable attenuator (VVA) followed by a three-stage, high efficiency, Gallium Arsenide (GaAs) power amplifier. However, when the output power of the PA is reduced by increasing VVA attenuation, which backs off on the drive level, the PA behaves as if it were a class-A amplifier. The operating efficiency of the transmitter is lowered when the amplifier is backed off.

In mobile digital cellular communication systems, the RF output power amplifier consumes a large portion of the battery power budget. A PA with poor efficiency will drain the battery and result in a greatly reduced talk time. Therefore, a constant current PA for the cellular application is undesirable due to the increased power consumption when the PA is backed off. The mobile transmitter should provide low current drain on the battery whenever maximum output power is not required.

SUMMARY OF THE INVENTION

In accordance with the principles of the invention, a technique for controlling the efficiency in an RF power amplifier is provided. The technique relies on a VVA and the dynamic control of the gate voltages of a GaAs PA to change the operating current of the PA. This power control technique uses a simple voltage ratio approach to supply specific voltages to the VVA, and the gates of the PA. The technique provides an effective means of increasing the efficiency of a GaAs power amplifier over the lower portion of the operating output power range. It also enhances the PA's performance when the battery has just been recharged and is near the high end of its output voltage specification. When the supply voltage rises, the current required by the PA can be reduced while maintaining the same output power.

BRIEF DESCRIPTION OF THE DRAWINGS

So that one skilled in the art to which the subject invention appertains will better understand how to practice the present invention, preferred embodiments of the apparatus and method will be described in detail hereinbelow with reference to the drawings wherein.

DETAILED DESCRIPTION OF THE PREFERRED EMBODIMENTS

Figure 1:
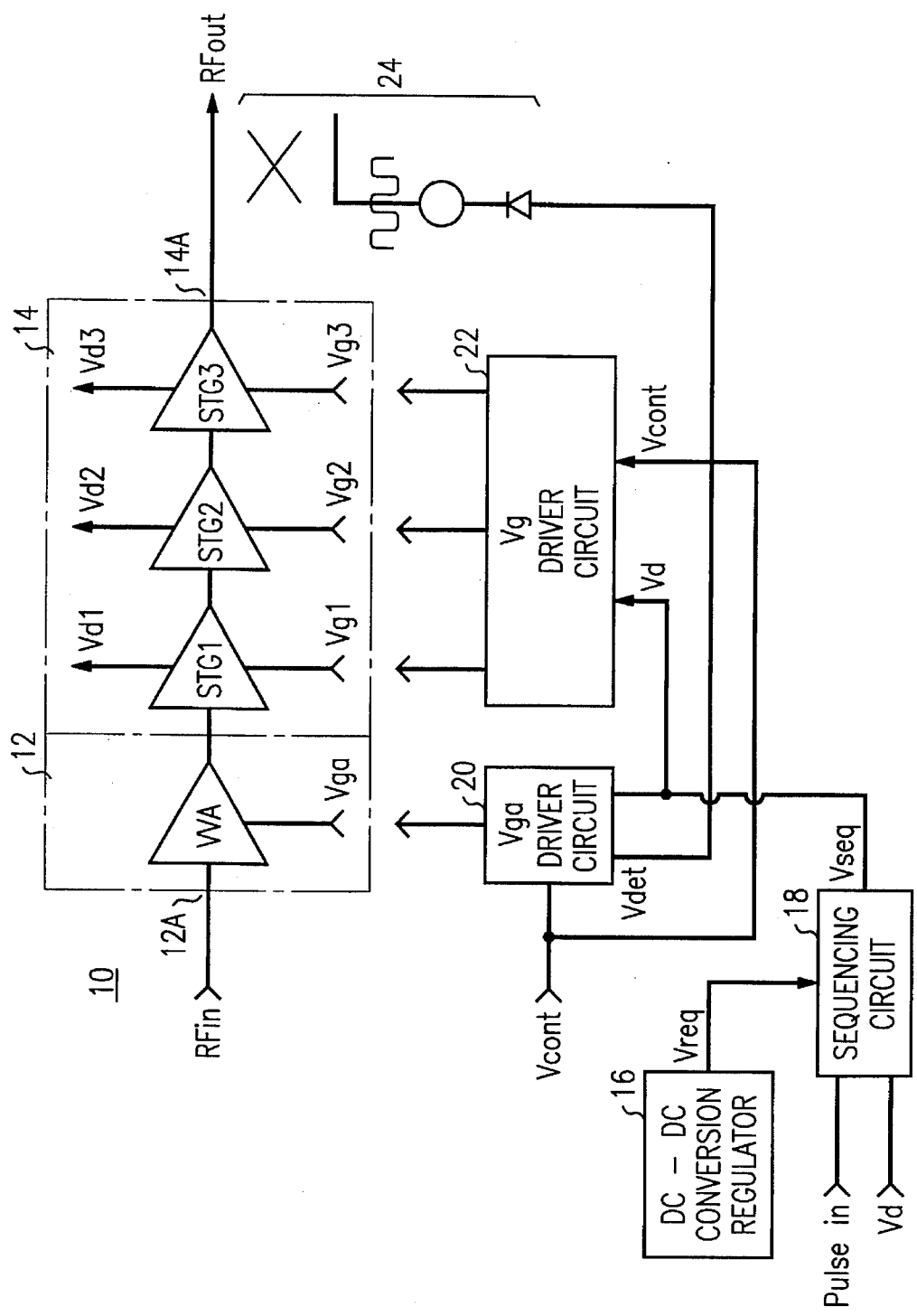
FIG. 1 is a schematic block diagram of a RF power amplifier in accordance with the present invention.

FIG. 1 illustrates, in a simplified manner, the desired operation of the control circuit for the RF power amplifier shown generally at 10. An incoming RF signal enters the input port 12A of the voltage variable attenuator (VVA) 12. The signal is then amplified by the RF power amplifier (PA) 14. After passing through the amplifier 14, a portion of the output signal 14A is sampled using a coupler 24. The sampled signal is detected and filtered, and provides a power dependent reference (Vdet) voltage for the driver circuit (Vga) 20. The driver circuit 20 then controls the VVA 12. The Vga driver circuit 20 is in itself sequenced by a sequencing circuit 18 which is powered through a DC-DC voltage conversion regulator 16. The sequencing circuit 18 also controls a power amplifier stage gate driver circuit 22. The Vga driver circuit 20 is controlled by a programmed power control voltage (Vcont) 53 and Vdet. A portion of Vcont 53 is used to provide the optimum gate bias (Vg1, Vg2, and Vg3) of the power amplifier 14.

Figure 2:
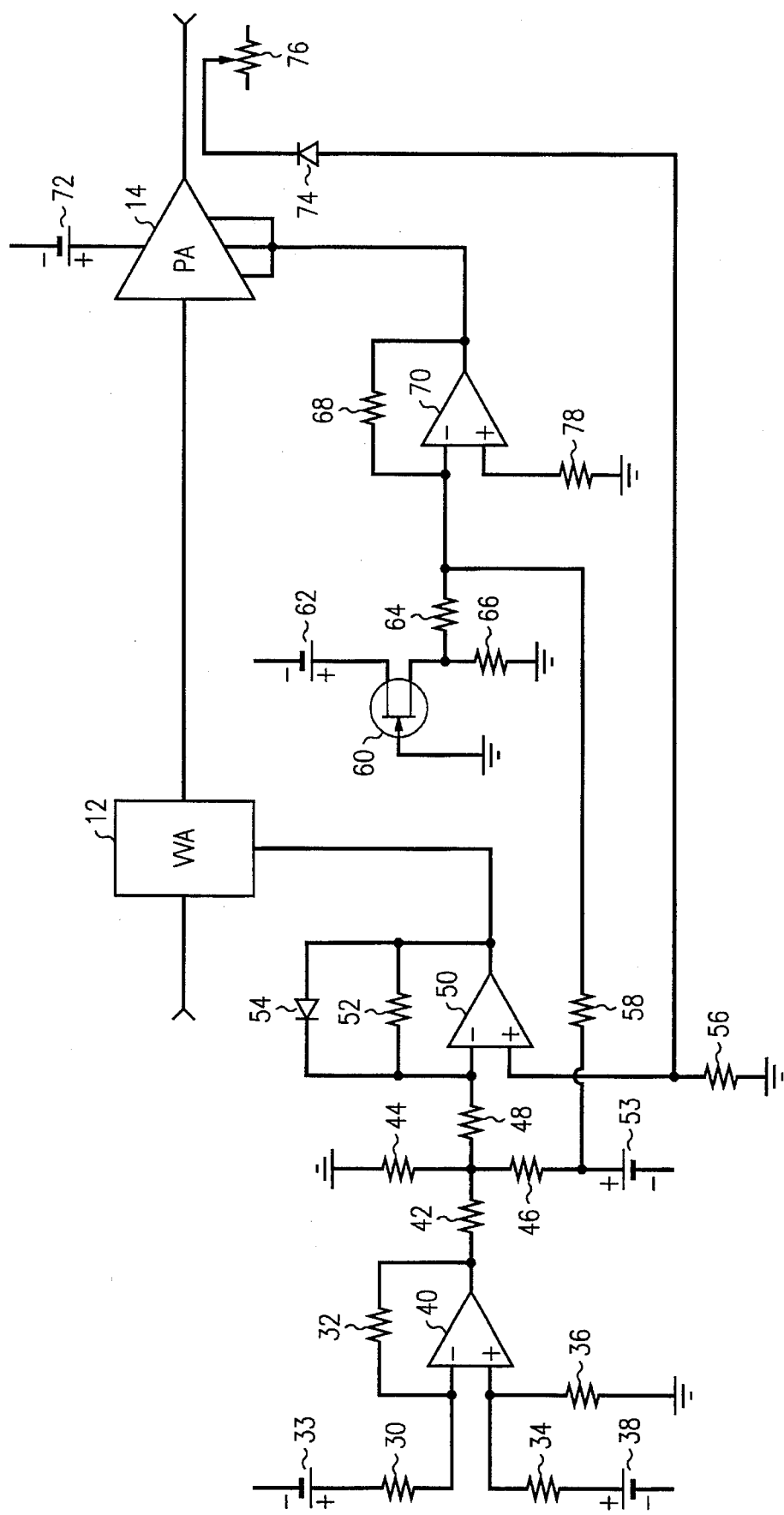
FIG. 2 is a detail schematic diagram of FIG. 1.

A more detailed description of the circuit of the present invention is shown in FIG. 2. The RF signal enters the VVA 12 at 12A and is then amplified in the power amplifier 14. The output 14A of the PA 14 is powered by voltage Vd 72. The sampled RF is attenuated using a fixed attenuator built into a diode 74 fed into a detector and a low pass filter as a combination of the diode 74 and resistor; and after 56. The capacitive portion of the filter is inherent in the diode 74 and the resistor 56 determines the time constant of the circuit. The filtered voltage is fed into the noninverting terminal of an operational amplifier (op amp) 50. The output of the op 50 is fed back through a resistor 52 and diode 54 in parallel to the inverting terminal of the op amp 50 to form the amplification. A proportional control signal is injected into the inverting terminal of the op amp 50 through resistor 48.

The control signal is created from Vd pulse voltage 33 going across resistor 30 and into the inverting terminal of op amp 40. The non-inverting terminal of op amp 40 is fed by part of voltage Vdd 38 through resistor 34, the other part going through resistor 36 to ground. The output of the op amp 40 is fed back into the inverting terminal via resistor 32 as well as through resistor 42 to form the control signal. With the use of voltage Vcont 53 and resistors 44, 46, and 48, proportional control signal is injected into op amp 50 and a ratio portion of the control voltage will control the VVA 12. The other portion is injected into the inverting terminal of operational amplifier 70 via resistor 58. A threshold reference voltage is provided by a reference MESFET 60. The voltage is determined by the voltage Vdd 62 along with resistors 64 and 66. The reference voltage is also injected into the inverting terminal of op amp 70. The noninverting terminal of op amp 70 is grounded through resistor 78. The output of op amp 70, along with doubling back through resistor 68 to the inverting input, is used for the gate biases (Vg1, Vg2 and Vg3) of the PA 14. When the output requirements are less than maximum, the voltage ratio will become more negative which will result in less DC current, thus improving efficiency. As the RF output power required increases, the ratio will become more positive, allowing the PA 14 to go to its maximum output. Likewise, when the DC voltage varies, the PA's output power, which is now directly related, will vary. The VVA 12 and gate voltages will be applied accordingly to provide the desired PA output power with enhanced efficiency.

Although the subject invention has been described with respect to the preferred embodiments, it will be readily apparent to those having ordinary skill in art to which it appertains that changes and modifications may be made thereto without departing from the spirit or scope of the invention as defined by the appended claims.

What is claimed is:

1. An apparatus for controlling efficiency in an RF power amplifier comprising:

a voltage variable attenuator;

RF power amplification means; and dynamic voltage controlling means of said RF power amplification means including a voltage ratio technique between said voltage variable attenuator and a plurality of gates of said RF power amplification means controlling RF power output and a power amplifier multistage driver circuit includes at least one operational amplifier to create a ratio portion of a proportional control signal to control a plurality of gate biases of said power amplifier.

2. The apparatus of claim 1 wherein said RF power amplification means is a multi-stage power amplifier.

3. The apparatus of claim 2 wherein said power amplifier further comprises three stages.

4. The apparatus of claim 1 wherein said dynamic voltage controlling means further comprises an extraction means for extracting part of the power output signal coupler and a voltage variable attenuator driver circuit.

5. The apparatus of claim 4 wherein said extraction means is an RF coupler at the output of said RF power amplification means feeding into said voltage variable attenuator driver circuit.

6. An apparatus for controlling efficiency in an RF power amplifier comprising;

a voltage variable attenuator;

RF power amplification means; and dynamic voltage controlling means of said RF power amplification means including a voltage ratio technique between said voltage variable attenuator and a plurality of gates of said RF power amplification means controlling RF power output, an extraction means for extracting part of the power output signal coupler, a multi-stage power amplifier bias driver circuit and a voltage variable attenuator driver circuit including at least one operational amplifier to create a proportional control signal to control said voltage variable attenuator.

7. The apparatus of claim 1 wherein said ratio portion of said proportional control signal further controls said voltage variable attenuator.

8. A method for controlling efficiency in an RF power amplifier, comprising the steps of:

amplifying an incident RF signal through a voltage variable attenuator and a power amplifier;

sampling a portion of said RF signal filtering said sampled portion of said RF signal;

amplifying a control portion of said filtered signal to control said voltage variable attenuator; and creating a ratio portion between said control portion and a threshold voltage to control a plurality of gate biases of said power amplifier.

9. The method of claim 8 wherein said amplifying of said control portion further comprises the step of injecting said sampled portion of said RF signal into at least one operational amplifier.

10. The method of claim 8 wherein said creating ratio portion further comprises the step of injecting said control portion and said threshold voltage into at least one operational amplifier.

* * * * *